(12) United States Patent
Hui et al.

(10) Patent No.: US 6,432,618 B1
(45) Date of Patent: Aug. 13, 2002

(54) METHOD FOR FORMING HIGH QUALITY MULTIPLE THICKNESS OXIDE LAYERS BY REDUCING DESCUM INDUCED DEFECTS

(75) Inventors: Angela T. Hui, Fremont; Jusuke Ogura, Cupertino, both of CA (US)

(73) Assignees: Advanced Micro Devices, Inc., Sunnyvale, CA (US); Fujitsu Limited (JP)

( * ) Notice: Subject to any disclaimer, the term of this patent is extended or adjusted under 35 U.S.C. 154(b) by 0 days.

(21) Appl. No.: 09/535,255

(22) Filed: Mar. 23, 2000

Related U.S. Application Data

(60) Provisional application No. 60/181,709, filed on Feb. 11, 2000.

(51) Int. Cl.⁷ .............................................. H01L 21/302
(52) U.S. Cl. ........................ 430/311; 430/315; 438/745
(58) Field of Search ................................ 430/311, 315; 438/745

(56) References Cited

U.S. PATENT DOCUMENTS

| | | | |
|---|---|---|---|
| 4,496,423 A | 1/1985 | Walton | |
| 4,591,547 A | 5/1986 | Brownell | |
| 5,672,521 A | 9/1997 | Barsan et al. | |
| 5,858,109 A * | 1/1999 | Hymes et al. | 134/2 |
| 5,882,489 A | 3/1999 | Bersin et al. | |
| 5,926,708 A | 7/1999 | Martin | |
| 6,004,839 A * | 12/1999 | Hayashi et al. | 438/210 |
| 6,024,106 A * | 2/2000 | Yang et al. | 134/1.3 |
| 6,120,616 A * | 9/2000 | Bahten | 143/42 |
| 6,162,738 A * | 12/2000 | Chen et al. | 438/745 |
| 6,187,684 B1 * | 2/2001 | Farber et al. | 438/704 |
| 6,203,683 B1 * | 3/2001 | Austin et al. | 204/547 |
| 6,312,527 B1 * | 11/2001 | Jolley | 134/2 |
| 6,350,322 B1 * | 2/2002 | Yates | 134/3 |

\* cited by examiner

*Primary Examiner*—Rosemary Ashton
*Assistant Examiner*—Amanda C. Walke
(74) *Attorney, Agent, or Firm*—Amin & Turocy, LLP

(57) ABSTRACT

A method for forming high quality oxide layers having different thicknesses by eliminating descum induced defects. The method includes forming an oxide layer, masking the oxide layer with a photoresist layer, developing the photoresist layer to expose a region of the oxide layer. The substrate is then descummed to remove any residue resulting from the development of the photoresist. Following the descum process, the substrate is rinsed in water. The oxide layer is then etched, and the remaining photoresist is stripped before another layer of oxide is grown on the substrate.

18 Claims, 6 Drawing Sheets

METHOD FOR FORMING HIGH QUALITY MULTIPLE THICKNESS OXIDE LAYERS BY REDUCING DESCUM INDUCED DEFECTS

This application claims priority to provisional application No. 60/181,709 filed on Feb. 11, 2000, now pending.

FIELD OF THE INVENTION

The present invention pertains to the field of integrated circuit devices and manufacturing processes for the same. More particularly, this invention relates to the formation of high quality multiple thickness oxide layers on a silicon wafer substrate.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

High voltage circuit elements such as program and erase transistors are usually formed on a wafer substrate with a relatively thick gate oxide layer. Such relatively thick gate oxide layers are usually required to prevent transistor circuit breakdown in such a high voltage environment. On the other hand, it is preferable that the low voltage circuitry is implemented with relatively thin gate oxide layers on the wafer substrate. Such thin gate oxide layers typically increase the speed of such circuit elements having relatively short gate lengths and thin oxide layers typically provide increased operation speeds.

In addition, as process technologies evolve toward shorter and shorter gate lengths it is desirable to reduce the thickness of the gate oxide layer even further in order to achieve greater operating speed. However, some circuit elements contained on such integrated circuit devices may not be scalable.

Non-volatile memory devices, such as flash EEPROMs require the formation of flash memory cells that include tunnel oxide layers on the wafer substrate. Such tunnel oxide layers may be thinner than high voltage oxide layers on the wafer substrate. However, such tunnel oxide layers usually cannot be scaled down in thickness in the same manner as low voltage oxide layers. Such flash memory cells, for example, typically suffer from significant endurance and data retention problems if the tunnel oxide layers are too thin.

Therefore, non-volatile memory devices can usually benefit from the formation of differing oxide thicknesses on the same wafer substrate. Transistors with relatively thick select gate oxide layers can accommodate high voltage program and erase operations while logic transistors with relatively thin gate oxide layers can yield speed advantages as process technologies evolve toward smaller circuit element dimensions. In addition, the thickness of tunnel oxide layers for flash memory cells can be scaled for reliability independent of the gate dimensions and oxide thickness of the high and low voltage transistors.

One method of forming high quality multiple thickness oxide layers involves multiple masking and oxide formation steps. For example, a first oxide layer, usually the thickest oxide layer, is initially grown on the wafer substrate. Thereafter, a layer of photoresist is formed on the first oxide layer. A pattern is formed on the photoresist layer by exposing the photoresist through a mask. The photoresist is then developed and removed, leaving a portion of the oxide layer exposed. Subsequently, the first oxide layer is etched and the remaining photoresist is stripped. A second layer of oxide is then grown on the wafer substrate. The second oxide layer forms a thin oxide layer on the wafer substrate while a thicker oxide layer is formed by the combination of the first and second oxide layers. This process can be repeated to form additional oxide layers with various thicknesses throughout the process flow.

During and after development of the photoresist layer, the unmasked or exposed portion of the oxide layer may become contaminated. For example, a thin film, undetectable on visual inspection, may form on the exposed portion of the oxide layer. This film may consist of photoresist residue such as dried developer and undissolved pieces of photoresist. Thus, it is usually necessary to subject the unmasked portion of the oxide layer to a cleaning or descumming process to remove the resist residue. The unmasked or exposed portion of the oxide layer is often descummed or cleaned with $O_2$, $O_2/N_2$ or $O_2/N_2$—$H_2$ chemistries in a barrel asher or a downstream single wafer asher.

Although the descum process is relatively short in order to avoid any surface damage of the exposed oxide layer, the descum process itself leaves contaminants on the oxide layer. The contaminants appear as dark spots on the oxide layer under a high resolution scanning electron microscope (SEM) as shown in FIG. 1. An analysis of the dark spots shows that they consist of sulfur compounds and small hydrocarbons, most likely photo active compound, left over from the development of the photoresist. These dark spots or defects on the surface of the exposed oxide layer interact with subsequent processing steps, which creates processing problems and degrades reliability and yield.

For example, when a wet oxide etch is carried out after descum to remove the exposed portion of an oxide layer, the oxide layer under the dark spots cannot be completely removed. Thus, the dark spots act as a micromask on the exposed portion of the oxide layer. As a result of the dark spots, a subsequently grown oxide layer may not be uniform because the initial oxide layer is not completely removed.

Therefore, it would be desirable to have a process for removing these dark spots or defects when forming multiple thickness gate and tunnel oxide layers in order to achieve a higher overall yield of acceptable wafers.

BRIEF SUMMARY OF THE INVENTION

A method for forming uniform oxide layers in a semiconductor device by reducing descum induced defects is disclosed. The method includes rinsing a semiconductor substrate with deionized (DI) water. The substrate includes a wafer, an oxide layer on the wafer, a developed photoresist mask on the oxide layer, an exposed region on the oxide layer, and contaminants on the exposed region of the oxide layer resulting from the conventional descum process. After the substrate is rinsed, the exposed region of the oxide layer is etched.

Other features and advantages of the present invention will be apparent from the detailed description of the invention.

It should be appreciated that for simplicity and clarity of illustration, elements shown in the Figures have not necessarily been drawn to scale. For example, dimensions of some of the elements are exaggerated relative to each other for clarity.

DETAILED DESCRIPTION OF THE INVENTION

Figure 2:
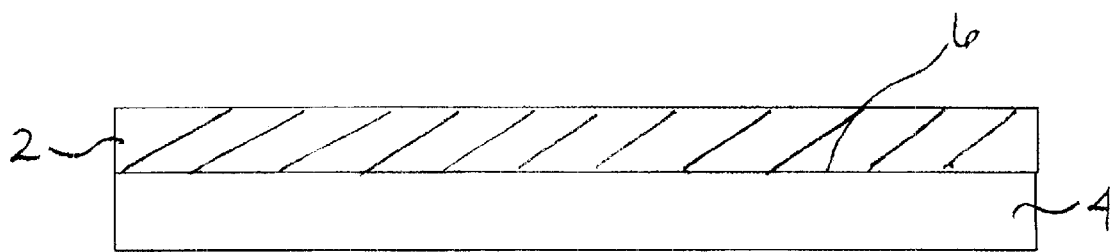
FIG. 2 is a partial cross-sectional view of an oxide layer formed a wafer substrate.

Referring to FIG. 2, first oxide layer 2, the select gate oxide layer, is formed to overlie the surface of semiconductor substrate 4. Preferably, semiconductor substrate 2 is a single crystal silicon substrate. Semiconductor substrate 4 has an upper surface 6 previously processed to remove debris and native oxides. Preferably, the select gate oxide layer 2 is formed by thermally oxidizing surface 6 at an elevated temperature in the presence of ambient dry oxygen or steam. Preferably, the oxidation process is carried out at a temperature of about 700 to about 1400° C. The oxidation process forms a silicon oxide layer preferably having a thickness of about 50 to about 150 angstroms, and more preferably a thickness of about 90–100 angstroms. The oxidation process may be carried out in a batch-type thermal oxidation furnace.

Figure 3:
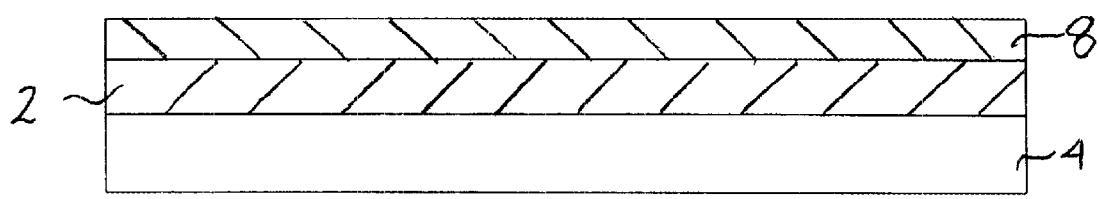
FIG. 3 is a partial cross-sectional view of the substrate after the formation of a photoresist layer on the oxide layer.
Figure 4:
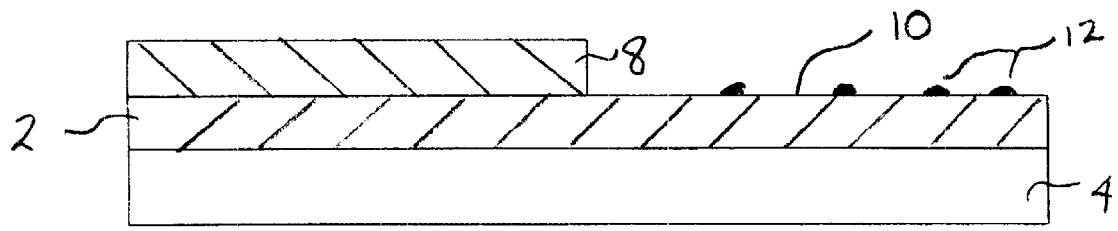
FIG. 4 is a partial cross-sectional view of the wafer substrate after the photoresist has been developed and the substrate has been descummed.

After forming the select gate oxide layer 2, the substrate is processed to remove any impurities, and a photoresist layer 8 is formed to overlie the first oxide layer as illustrated in FIG. 3. Preferably, photoresist layer 8 is ultraviolet sensitive and is a positive resist. Selected portions of the photoresist layer 8 are then exposed through a mask. The exposed photoresist is then developed and removed leaving a portion 10 of the oxide layer exposed. The photoresist layer may be developed by methods generally known in the art including but not limited to, immersion, spray and puddle techniques. FIG. 4 illustrates the exposed portion 10 of the select gate oxide layer 2.

Figure 1:
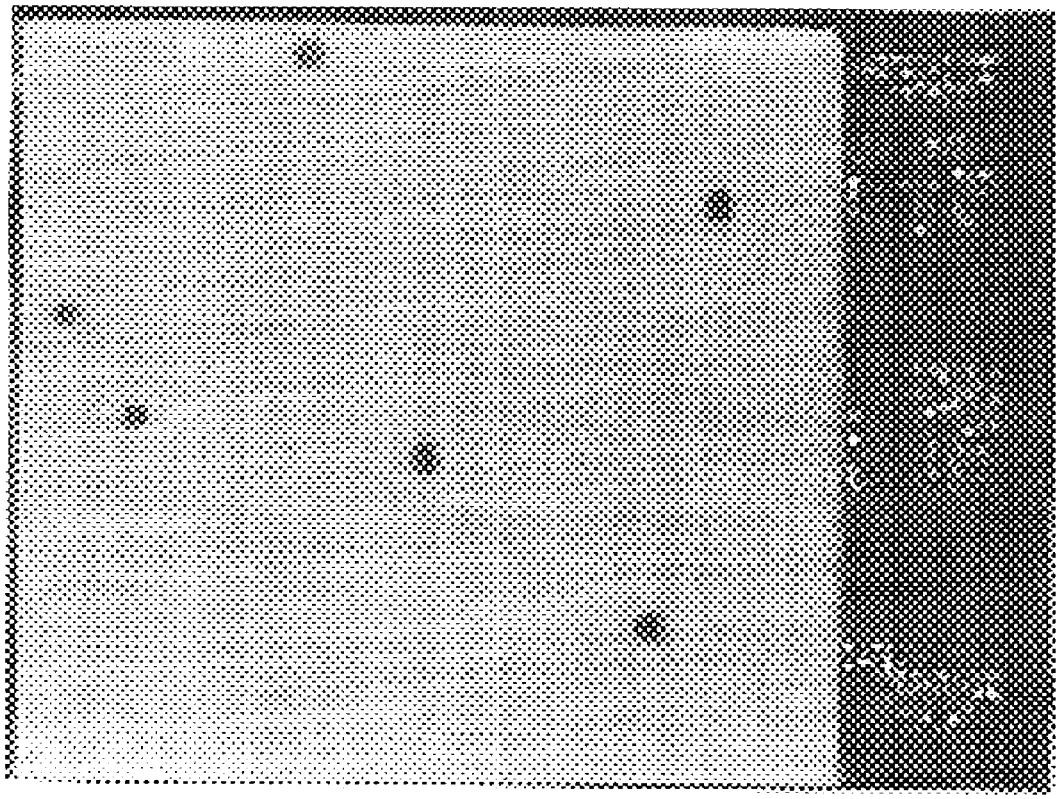
FIG. 1 is a photograph of the unwanted dark spots or defects on a wafer substrate after descum.

After the resist is developed and removed, the substrate is subjected to a descum process in order to remove organic residue such as dried developer or undissolved photoresist which may appear on the surface of the oxide layer. The descum process can be carried out in a conventional barrel type batch asher or a down stream single asher using $O_2$, $O_2/N_2$, $O_2/N_2$—$H_2$, or $O_2/He/Ar$ chemistries. In order to maintain the integrity of the photoresist layer and ensure pattern quality, the descum process is relatively short and not more than 30 nm of the photoresist layer and 1 nm of the oxide layer are removed. FIG. 4 illustrates the defects 12 that are left on exposed oxide layer 10 after the descum process. As shown in FIG. 1 and depicted in FIG. 4, the defects show up as dark spots on the surface of the exposed portion of the oxide layer.

In order to remove dark spots or defects 12, the substrate 2 is rinsed with DI water to remove any soluble residues. The water rinse may be carried out any method known in the art of semiconductor fabrication including but not limited to, conventional overflow rinsers, cascade rinsers, spray rinsers, dump rinsers or sonic assisted rinsers. Preferably, the substrate is rinsed in deionized water at room temperature in an overflow rinser for between 3 to 15 minutes. More preferably, the substrate is rinsed in an overflow rinser for between 9 to 10 minutes.

Figure 5:
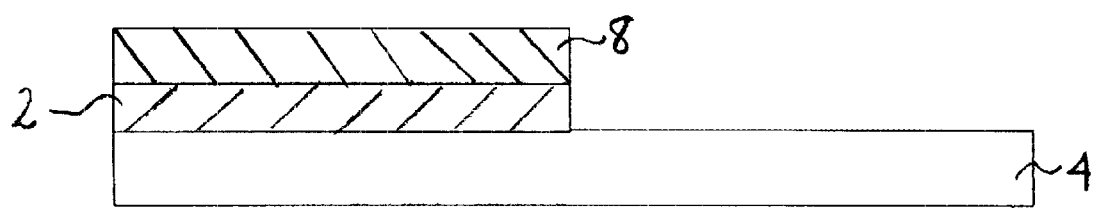
FIG. 5 is a partial cross-sectional view of the wafer substrate after a DI water rinse and the oxide layer has been etched.

After the rinsing step has been completed, the exposed portion of oxide layer 10 is etched away as illustrated in FIG. 5. The oxide layer may be etched by conventional wet methods that are well known in the art of semiconductor fabrication. Wet etch methods include using hydrofluoric acid. Preferably, a standard buffered oxide etch of hydrofluoric acid, ammonium fluoride and water is used to etch the exposed portion of the oxide layer.

Figure 6:
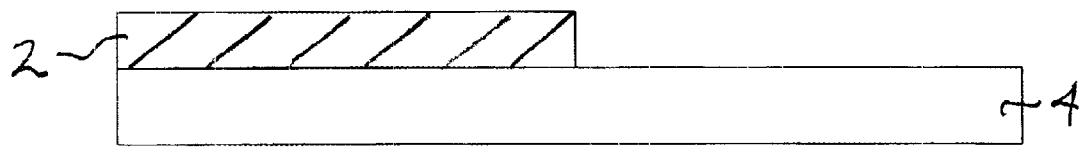
FIG. 6 is a partial cross-sectional view of the wafer substrate after the photoresist layer has been stripped.
Figure 7:
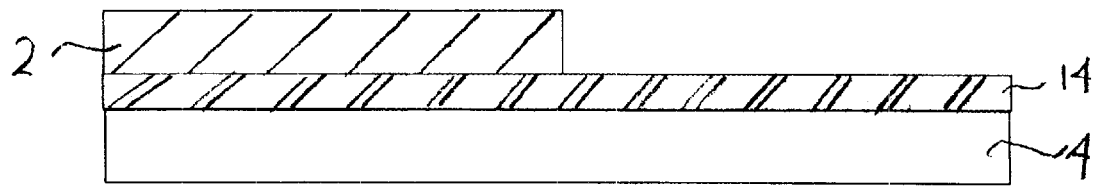
FIG. 7 is a partial cross-sectional view of a wafer substrate after a second layer of oxide has been grown.

After the exposed portion 10 of the select gate oxide layer 2 is etched, the remaining photoresist 8 is stripped as shown in FIG. 6. Both wet and dry methods that are well known in the art of semiconductor fabrication can be used to strip the remaining photoresist layer 8. Such methods include but are not limited to use of sulfuric acid and oxidant solutions and conventional $O_2$ plasma stripping. A new oxide layer 14, the tunnel oxide layer, is then grown on the surface of the wafer substrate 4 as shown in FIG. 7 to produce two oxide layers having different thicknesses. The tunnel oxide layer forms a thin oxide layer while the combination of the select gate oxide layer and the tunnel gate oxide layer form a thicker oxide layer.

Figure 8:
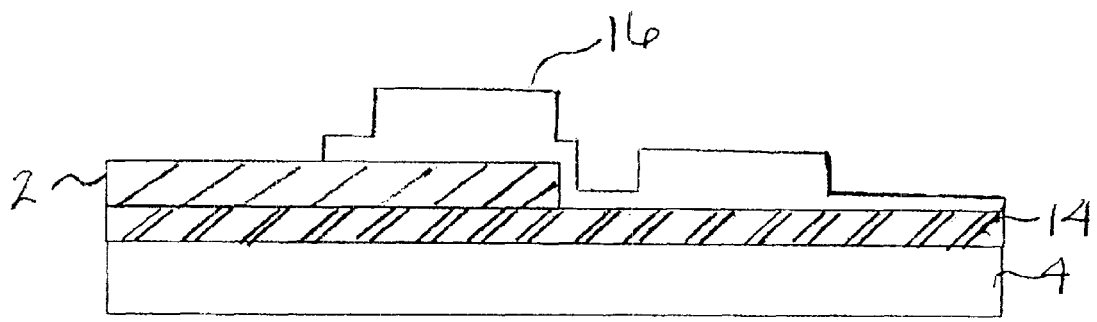
FIG. 8 is a partial cross-sectional view of a wafer substrate after the formation of a floating gate on the first and second oxide layers.
Figure 9:
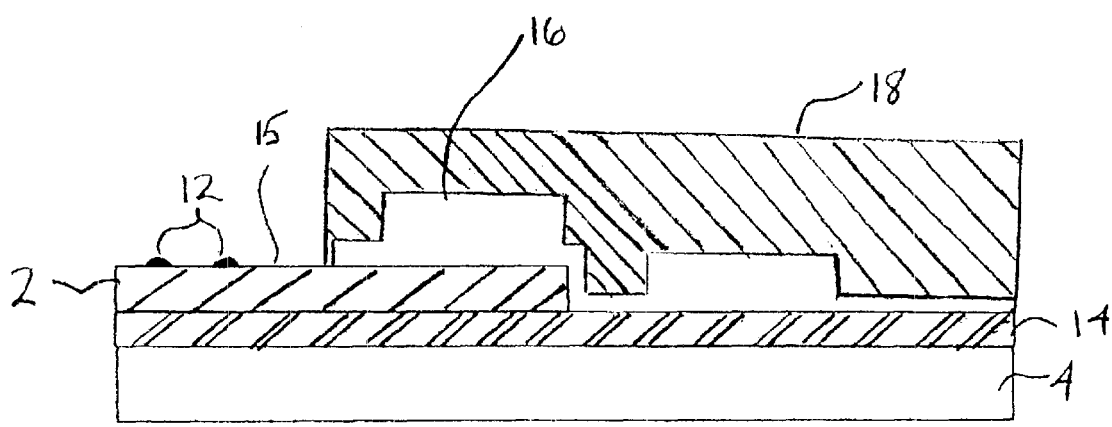
FIG. 9 is a partial cross-sectional view of a wafer substrate after formation and development of a photoresist layer and after the substrate has been descummed.
Figure 10:
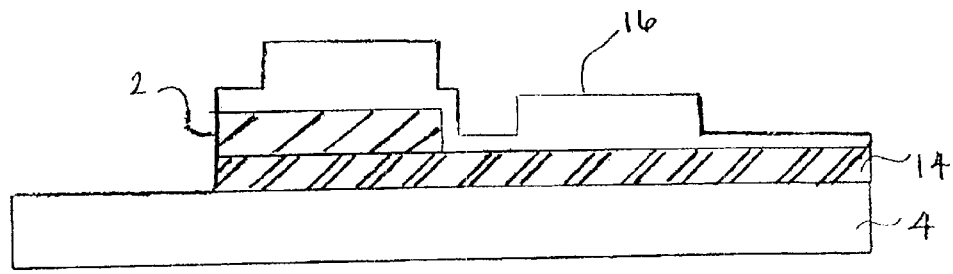
FIG. 10 is a partial cross-sectional view of a wafer substrate after a DI water rinse and the oxide layers have been etched.
Figure 11:
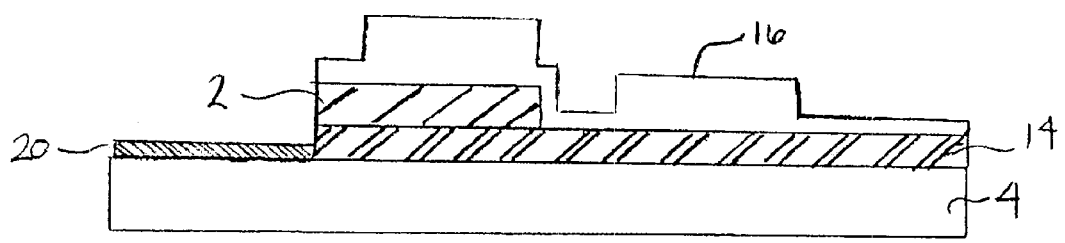
FIG. 11 is a partial cross-sectional view of the wafer substrate after a third layer of oxide has been grown.

The process described above may be repeated to create additional oxide layers with various thicknesses. For example, after growing the tunnel oxide layer 14, a floating gate 16 is formed over oxide layers 2 and 14 as shown in FIG. 8. A photoresist layer 18 is then formed to overlie oxide layers 2 and 14 and gate structure 16. As shown in FIG. 9, the photoresist layer 18 is exposed through a mask, and the exposed photoresist is then developed and removed leaving a portion 15 of oxide layers 2 and 14 exposed. After the resist is developed and removed, the substrate is descummed, and resulting defects 12 shown in FIG. 9 are removed by rinsing the substrate in DI water. After the rinsing step has been completed, the exposed portion 15 of oxide layers 2 and 14 is etched away and the remaining photoresist is stripped away as shown in FIG. 10. As illustrated in FIG. 11, a third oxide layer 20, the peripheral gate oxide layer, having a thickness different than oxide layers 2 and 14 is grown on the surface of wafer substrate 4.

Thus, there has been disclosed in accordance with the invention a process for fabricating multiple thickness uniform oxide layers in a semiconductor device that fully provides the advantages set forth above. The disclosed method can double the yield of acceptable wafers for further processing. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A method for processing a semiconductor structure comprising sequentially performing the acts of:

providing the semiconductor structure comprising an oxide layer and a photoresist layer over the oxide layer;

patterning the photoresist layer exposing a portion of the oxide layer;

descumming the semiconductor structure;

rinsing the descummed semiconductor structure to remove residue from the exposed portion of the oxide layer; and etching the exposed portion of the oxide layer from the rinsed and descummed semiconductor structure.

2. The method of claim 1, wherein said water is room temperature deionized water.

3. The method of claim 2, wherein the rinsing is performed by a member selected from the group consisting of an overflow rinser, a cascade rinser, a spray rinser, a dump rinser, or a sonic assisted rinser.

4. The method of claim 2, wherein the rinsing is carried out for from 3 to 15 minutes.

5. The method of claim 1, wherein the descummed substrate is prepared by using an $O_2$, $O_2/N_2$, $O_2/N_2$—$H_2$ or $O_2/He/Ar$ ashing process.

6. The method of claim 5, wherein the descum process is carried out in a barrel asher or a downstream single wafer asher.

7. The method of claim 1, further comprising stripping the photoresist layer.

8. The method of claim 7, further comprising growing a second oxide layer on the substrate.

9. The method of claim 7, wherein the photoresist is stripped by plasma prepared from a gas comprising $O_2$ or a solution comprising sulfuric acid.

10. A semiconductor device made by the method of claim 8.

11. The method of claim 1, wherein the etching is selected from the group consisting of plasma etching, ion milling etching, reactive ion etching and hydrofluoric acid based etching.

12. A semiconductor device made by the method of claim 1.

13. A method of making an electronic device comprising:

fabricating a semiconductor structure by the method of claim 1; and forming an electronic device comprising said semiconductor structure.

14. A method of making a semiconductor device, comprising:

forming a semiconductor structure by the method of claim 1; and making a semiconductor device from said semiconductor structure.

15. A method for processing a semiconductor structure, comprising sequentially performing the acts of:

providing the semiconductor structure comprising a first, patterned oxide layer, a second oxide layer over the first, patterned oxide layer, and a photoresist over the second oxide layer;

patterning the photoresist exposing a portion of the second oxide layer;

descumming the semiconductor structure;

rinsing the descummed semiconductor structure to remove residue from the exposed portion of the second oxide layer; and etching the exposed portion of the second oxide layer from the rinsed and descummed semiconductor structure;

stripping the photoresist; and forming a third oxide layer over the semiconductor structure.

16. A semiconductor device made by the method of claim 15.

17. A method of processing a semiconductor structure comprising sequentially performing the acts of:

(a) providing a semiconductor substrate;

(b) growing a select gate oxide layer on the substrate;

(c) depositing a layer of a first photoresist over the select gate oxide layer;

(d) exposing and developing the first photoresist layer;

(e) descumming the substrate to remove any remaining photoresist residue;

(f) rinsing the substrate with DI water for between 3–15 minutes ;

(g) etching the select gate oxide layer;

(h) stripping the remaining first photoresist layer;

(i) growing a gate oxide layer on the wafer substrate;

(j) depositing a layer of a second photoresist over the select gate oxide layer and the gate oxide layer;

(k) exposing and developing the second photoresist layer;

(l) descumming the substrate to remove any remaining photoresist residue;

(m) rinsing the substrate with DI water for between 3–15 minutes;

(n) etching the select gate oxide and gate layers;

(o) stripping the remaining second photoresist layer; and (p) growing a tunnel oxide layer on the wafer substrate.

18. The method of claim 17, wherein descumming comprises contacting the substrate with at least $O_2$.

* * * * *